(12) United States Patent
Takemura

(10) Patent No.: US 6,834,007 B2
(45) Date of Patent: Dec. 21, 2004

(54) SEMICONDUCTOR MEMORY DEVICE

(75) Inventor: Takashi Takemura, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/681,247

(22) Filed: Oct. 9, 2003

(65) Prior Publication Data
US 2004/0174736 A1 Sep. 9, 2004

(30) Foreign Application Priority Data
Mar. 4, 2003 (JP) ........................................ 2003-056567

(51) Int. Cl.$^7$ ............................................. G11C 11/40
(52) U.S. Cl. ..................................... 365/154; 365/156
(58) Field of Search ................................. 365/154, 156

(56) References Cited

U.S. PATENT DOCUMENTS 5,388,067 A * 2/1995 Sato et al. .................. 365/154

OTHER PUBLICATIONS

Nobutaro Shibata et al., "A 1–V Battery Operated 0.25–um SRAM Macrocell for Portable Equipment," Technical report of IEICE, pp. 1–8.
US Publication No. 20030090928, Published May 15, 2003.
US Publication No. 2003–0189221, Published Oct. 9, 2003.

* cited by examiner

Primary Examiner—Son Mai
(74) Attorney, Agent, or Firm—Volentine Francos & Whitt, PLLC

(57) ABSTRACT

There is an SRAM which can perform a high-speed read operation at a low power supply voltage and which can simplify a circuit configuration and manufacturing steps. When signals at levels "H" and "L" are output from a flip-flop to storage nodes, respectively, the threshold voltage of first and second N-channel MOS transistors having channel regions connected to the storage node decrease to improve the current drive capabilities of the transistors. The second N-channel MOS transistor is set in an ON state by the level of the storage node. In this case, when a word line goes to level "H", the first N-channel MOS transistor is turned on, and a bit line is drawn in a ground potential at a high speed.

13 Claims, 4 Drawing Sheets

SEMICONDUCTOR MEMORY DEVICE

BACKGROUND OF THE INVENTION

1. Field of the Invention

The present invention relates to a semiconductor memory device and, more particularly, to a semiconductor memory device such as an SRAM (Static Random Access Memory) which can be operated at a low power supply voltage.

2. Description of the Related Art

An SRAM is popularly used as a cache memory such as an ASIC (Application-Specific Integrated Circuit) used in a mobile terminal or the like. Since the SRAM used for such a purpose uses a battery having a limited capacity as a power supply, the SRAM must be small in size and must be operated at a low power consumption. Since a power consumption is in proportion to the square of a power supply voltage, a reduction in power supply voltage is most effective in reducing a power consumption.

On the other hand, the reduction in power supply voltage reduces the operation speeds of MOS transistors constituting the SRAM. For this reason, the operation speeds of the MOS transistors are increased by reducing the threshold voltages of the MOS transistors. However, when the threshold voltage is reduced, a leak current generated by a sub-threshold current increases in a standby state to make it difficult to achieve an effective reduction in power consumption.

In order to solve the above object, a CMOS (Complementary MOS transistor) LSI technique which can be operated at a low power consumption in an active state and which slightly increases a power consumed by a leak current in a standby state, an MTCMOS (Multi-Threshold CMOS) technique is known.

FIG. 4 is a diagram showing the configuration of a conventional SRAM to which an MTCMOS technique described in Reference "Technical Report of IEICE, ICD97-52 (1997-6), IEICE, Shibata, Morimura et al. "1-V Operating 0.25 µm SRAM Macro-cell for Mobile Device" pp. 1 to 8".

This SRAM has a flip-flop (FF) 20 constituted by two inverters L1 and L2 connected to storage nodes N11 and N12, respectively, and each having a high threshold voltage. The storage nodes N11 and N12 are connected to bit line pair BL and /BL through write transistors Q1 and Q2 driven by a selection signal X of a word line WL and having a high threshold voltage.

In addition, the SRAM has read acceleration transistors Q3 and Q4 driven by the selection signal X of the word line WL and each having a low threshold voltage. The drain of the transistor Q3 is connected to the bit line BL, and the source thereof is connected to a virtual ground line VGND through a transistor Q5 having a low threshold voltage. Similarly, the drain of the transistor Q4 is connected to the bit line /BL, and the source thereof is connected to the virtual ground line VGND through a transistor Q6 having a low threshold voltage. The gates of the transistors Q5 and Q6 are connected to the storage nodes N12 and N11, respectively.

The virtual ground line VGND is connected to a ground potential GND through a transistor Q7 having a high threshold voltage. NOR between a bit line selection signal Y and a read control signal RE is generated by a logical gate L3 having a low threshold voltage and given to the gate of the transistor Q7.

The operation will be described below.

In a data write state, the word line WL goes to level "H", the transistors Q1 and Q2 are turned on, and data of the bit line pair BL and /BL are held in a flip-flop 1. At this time, since the transistor Q7 is in an OFF state, the virtual ground line VGND is in a floating state, no current flows in the transistors Q3 and Q4, and a write operation can be performed without hindrance.

In a data read state, the transistor Q7 is turned on by an output signal from the logical gate L3, and the virtual ground line VGND is connected to the ground potential GND (=level "L"). The word line WL goes to level "H", the transistors Q1 to Q4 are turned on. At this time, since any one of the storage nodes N11 and N12 is set at level "H", any one of the transistors Q5 and Q6 is turned on. In this manner, the bit line is driven by the inverters L1 and L2, and the bit line is driven by the low-threshold-voltage transistors Q3 to Q6 each having high current drive capability, so that the read operation can be performed at a high speed.

In a standby state, the transistor Q7 having a high threshold voltage is turned off, so that leak currents generated by sub-threshold currents of the transistors Q3 to Q6 each having a low threshold voltage can be interrupted. In this manner, a low power consumption in the standby state can be achieved.

However, a conventional SRAM has the following problem. The inverters L1 and L2 each having a high threshold voltage and the transistors Q1, Q2, and Q7 each having a high threshold voltage must be formed independently of the transistors Q3 to Q6 each having a low threshold voltage and the logical gate L3 each having a low threshold voltage. In general, a threshold voltage is set by controlling a dose of ion implantation into a silicon substrate. For this reason, a plurality of implantation masks corresponding the levels of the threshold voltages are used, ion implantation must be performed in a plurality of steps, and manufacturing steps are complicated. In a standby state, in order to interrupt leak currents generated by the sub-threshold currents of the transistors Q3 to Q6 each having a low threshold voltage, the virtual ground line VGND must be used to make the circuit configuration complex disadvantageously.

SUMMARY OF THE INVENTION

In order to solve the above problem, according to the present invention, there is provided a semiconductor memory device includes: first and second bit lines for inputting/outputting complementary data; first and second transistors for controlling connection between a first storage node and the first bit line and connection between a second storage node and the second bit line on the basis of a selection signal, respectively; a flip-flop for holding potentials of the first and second storage nodes to output the potentials; and the following acceleration circuit to perform a high-speed read operation at a low power supply voltage.

The acceleration circuit is constituted by third and fourth transistors, having channel regions connected to the second storage node, for controlling connection between the first bit line and a common potential on the basis of the potential of the second storage node in a selection state or a data read state, and fifth and sixth transistors, having channel regions connected to the first storage node, for controlling connection between the second bit line and the common potential on the basis of the potential of the first storage node in a selection state or a data read state.

According to the present invention, since the semiconductor memory device is constituted as described above, the following operation will be performed.

For example, when the first and second storage nodes are set at levels "H" and "L", respectively, in a data read state, the threshold voltages of the fifth and sixth transistors having channel regions connected to the first storage node set at level "H" decrease, and current drive capabilities of the fifth and sixth transistors are improved. In addition, the fifth and sixth transistors are turned on by the potential of the first storage node, and the second bit line is connected to the common potential. For this reason, data set at level "L" is rapidly output to the second bit line.

DETAILED DESCRIPTION OF THE PREFERRED EMBODIMENTS

Figure 1:
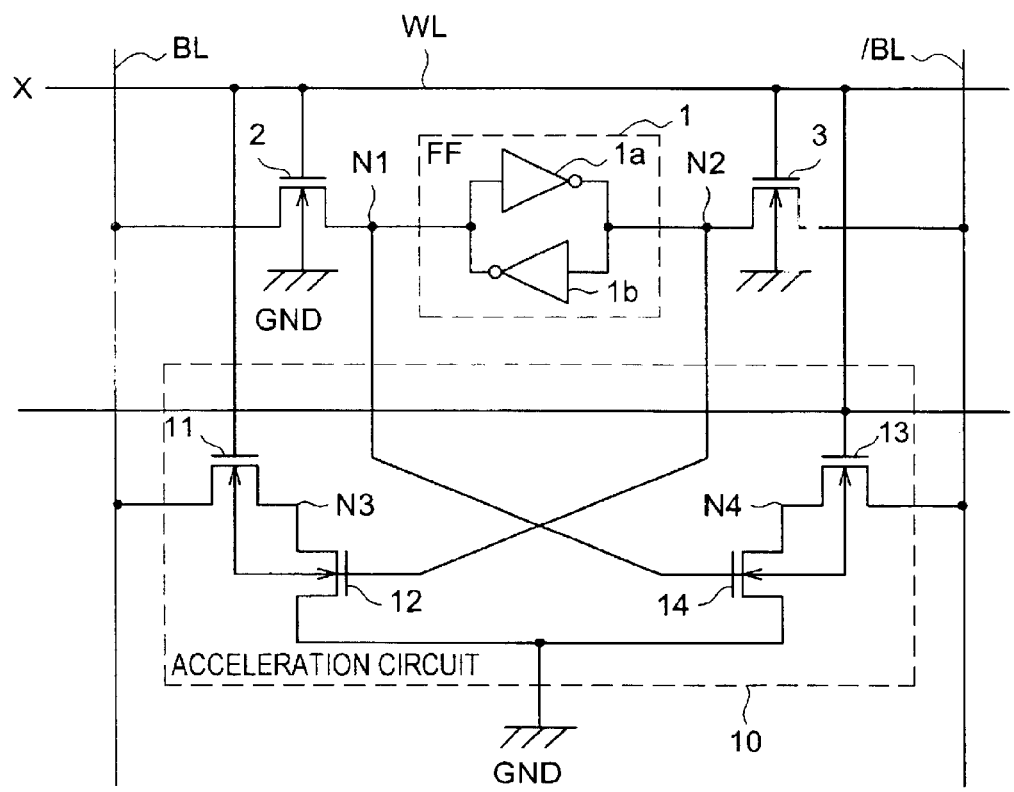
FIG. 1 is a diagram of the configuration of an SRAM according to the first embodiment of the present invention.

Preferred embodiments of a semiconductor memory device according to the present invention will be described below with reference to the accompanying drawings. The same reference numerals as in this specification and the drawings substantially denote constituent elements having substantially the same functional configurations to omit overlapping explanations.

(First Embodiment)

FIG. 1 is a diagram of the configuration of an SRAM showing the first embodiment of the present invention.

The SRAM is used in a mobile terminal using a low-voltage small-capacity battery such as a solar battery as a power supply, and is constituted by transistors having equal threshold voltages all of which are lower than the power supply voltage. This SRAM has a flip-flop 1 constituted by two inverters 1a and 1b which are connected to storage nodes N1 and N2 to hold data. The storage nodes N1 and N2 are connected to the bit lines BL and /BL through N-channel MOS transistors 2 and 3, for writing, driven by a selection signal X of a word line WL, respectively.

The SRAM has an acceleration circuit 10 for accelerating a read operation. The acceleration circuit 10 is constituted by N-channel MOS transistors 11 and 12 connected in series with each other through an internal node N3 between the bit line BL and a common potential (for example, ground potential) GND and N-channel MOS transistors 13 and 14 connected in series with each other through an internal node N4 between the bit line /BL and the ground potential GND. The gates of the N-channel MOS transistors 11 and 13 are connected to the word line WL. The channel regions of the N-channel MOS transistors 11 and 12 are connected to the storage node N2 together with the gate of the N-channel MOS transistor 12. The channel regions of the N-channel MOS transistors 13 and 14 are connected to the storage node N1 together with the gate of the N-channel MOS transistor 14.

Figure 2:
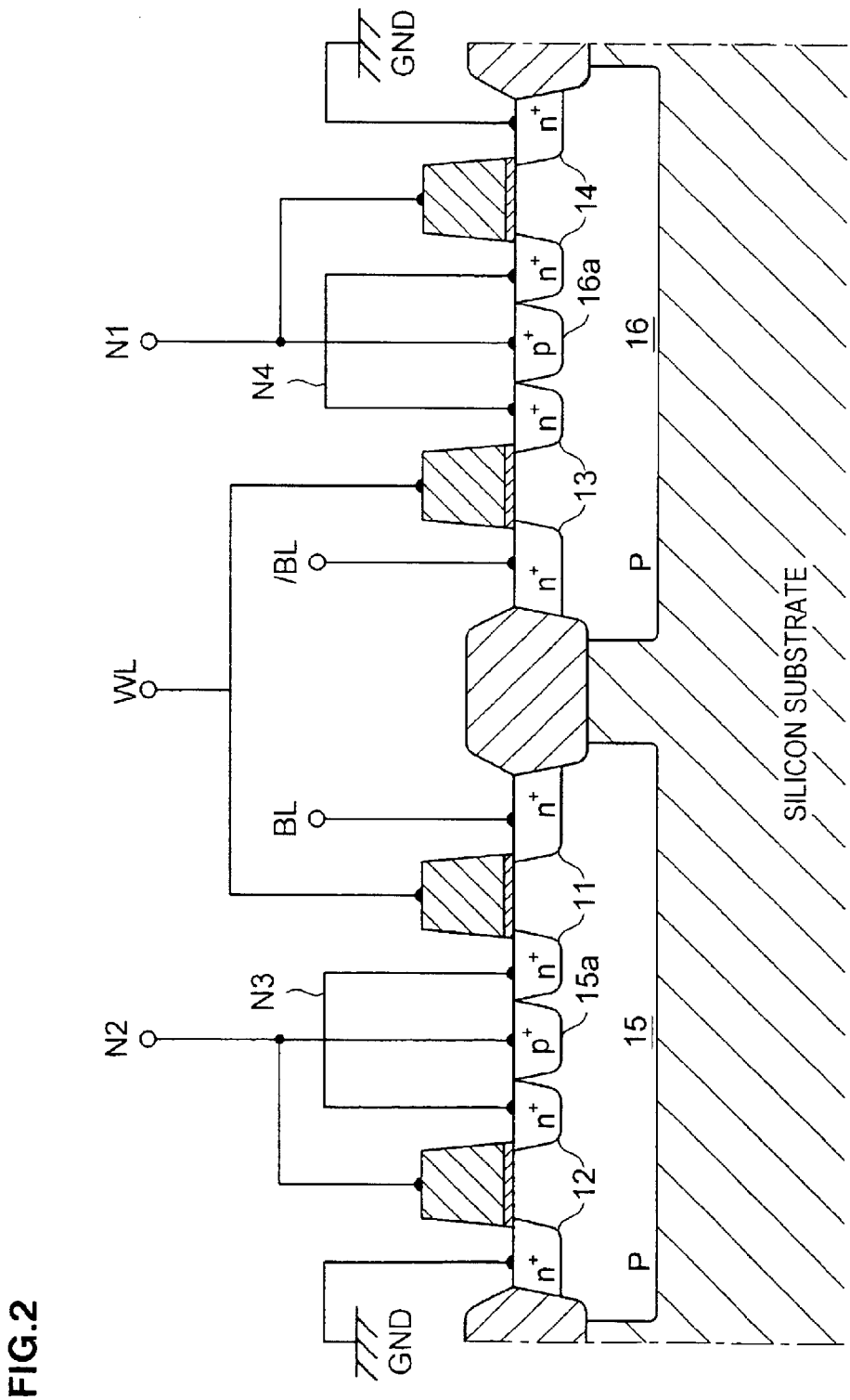
FIG. 2 is a cross-sectional view showing an example of the structure of an acceleration circuit 10 in FIG. 1.

FIG. 2 is a cross-sectional view showing an example of the structure of the acceleration circuit 10 in FIG. 1.

The acceleration circuit 10 is an example of a double-well CMOS configuration. The acceleration circuit 10 has a p-type well 15 for forming the N-channel MOS transistors 11 and 12 and a p-type well 16 for forming the N-channel MOS transistors 13 and 14 on an n-type silicon substrate. The p-type well 15 serves as the channel regions of the N-channel MOS transistors 11 and 12, and the p-type well 16 serves as the channel regions of the N-channel MOS transistors 13 and 14.

In the p-type well 15, an $n^+$-type region constituting the drain and source electrodes of the N-channel MOS transistors 11 and 12 and a $p^+$-type region constituting a well contact 15a for connecting the p-type well 15 to the storage node N2 are formed. On the surface of the p-type well 15, the gate electrodes of the N-channel MOS transistors 11 and 12 are formed through a gate insulating film. The gate electrode of the N-channel MOS transistor 11 is connected to the word line WL, and the gate electrode of the N-channel MOS transistor 12 is connected to the storage node N2 together with the well contact 15a.

Similarly, in the p-type well 16, a $n^+$-type region constituting the drain and source electrodes of the N-channel MOS transistors 13 and 14 and a $p^+$-type region constituting a well contact 16a for connecting the p-type well 16 to the storage node N1 are formed. On the surface of the p-type well 16, the gate electrodes of the N-channel MOS transistors 13 and 14 are formed through a gate insulating film. The gate electrode of the N-channel MOS transistor 13 is connected to the word line WL, and the gate electrode of the N-channel MOS transistor 14 is connected to the storage node N1 together with the well contact 16a.

In the acceleration circuit 10, a diode is formed between the p-type well 15 and the source of the N-channel MOS transistor 12 connected to the ground potential GND, and a diode is formed between the p-type well 16 and the source of the N-channel MOS transistor 14 connected to the ground potential GND, respectively. Therefore, the acceleration circuit 10 must be operated by a low power supply voltage (for example, 0.5 V) at which these diodes are not turned on.

An operation will be described below.

As a power supply voltage of the SRAM, a voltage of 0.5 V is supplied to a power supply terminal (not shown).

In a data write state, when the word line WL goes to level "H" while write data is transmitted to the bit line pair BL and /BL, the N-channel MOS transistors 2, 3, 11, and 13 are turned on. When the N-channel MOS transistors 2 and 3 are turned on, the data on the bit line pair BL and /BL are held in the flip-flop 1 between the storage nodes N1 and N2.

In the data, read state, any one of the storage nodes N1 and N2 goes to "H" depending on the value of data held in the flip-flop 1. For example, when the storage node N1 is set at level "H", the threshold voltages of the N-channel MOS transistors 13 and 14 having the channel regions connected to the storage node N1 decrease, and the current drive capabilities of the N-channel MOS transistors 13 and 14 increase. On the other hand, since the storage node N2 is set at level "L", the channel regions of the N-channel MOS transistors 11 and 12 are set at level "L", and the threshold voltages of the N-channel MOS transistors 11 and 12 do not decrease.

In this state, when the word line WL goes to level "H", the N-channel MOS transistors 2, 3, 11, and 13 are turned on. At this time, since the N-channel MOS transistors 13 and 14 serve as transistors which achieve high current drive capabilities by the potential of the storage node N1, the bit line /BL is driven by the flip-flop 1 and drawn in the ground potential GND at a high speed by the N-channel MOS transistors 13 and 14. In this manner, the potentials of the storage nodes N1 and N2 are read into the bit line pair BL and /BL.

In the SRAM, the threshold voltages of all the transistors are set at equal values, and a leak current of a low-threshold-voltage transistor in an OFF state need not be blocked. For this reason, there is no standby mode.

As described above, the SRAM according to the first embodiment has the acceleration circuit 10 constituted by the N-channel MOS transistors 13 and 14 having channel regions to which the potential of the storage node N1 corresponding to the bit line BL is given to draw the bit line /BL in the ground potential GND at a high speed and the N-channel MOS transistors 11 and 12 having channel regions to which the potential of the storage node N2 corresponding to the bit line /BL is given to draw the bit line BL in the ground potential GND at a high speed. For this reason, a high-speed read operation can be performed at a low power supply voltage, and a low power consumption can be advantageously achieved. Since the MTCMOS technique is not used, a virtual ground line is not required, and the circuit configuration and the manufacturing steps can be advantageously simplified.

(Second Embodiment)

Figure 3:
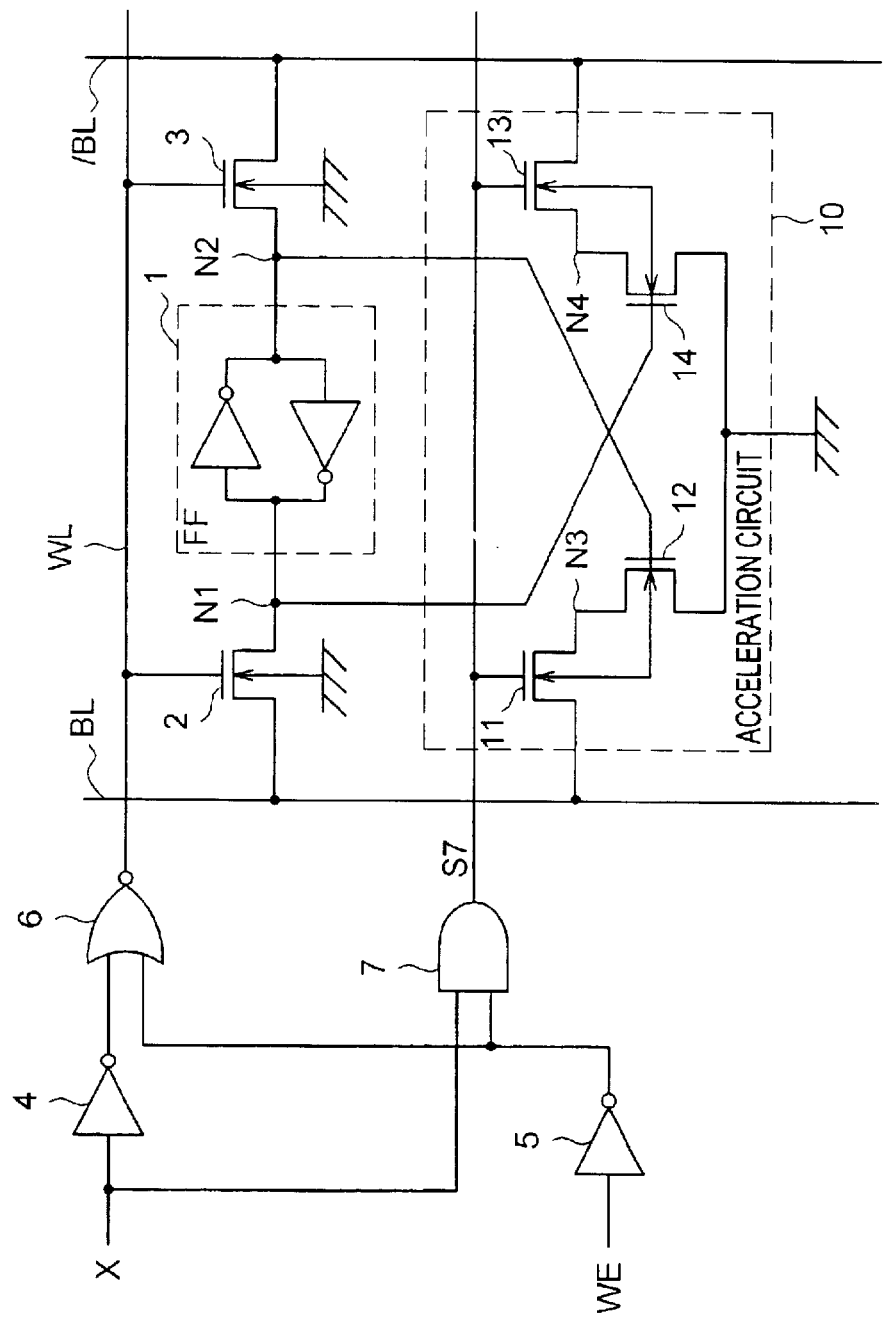
FIG. 3 is a diagram of the configuration of an SRAM according to the second embodiment of the present invention.
Figure 4:
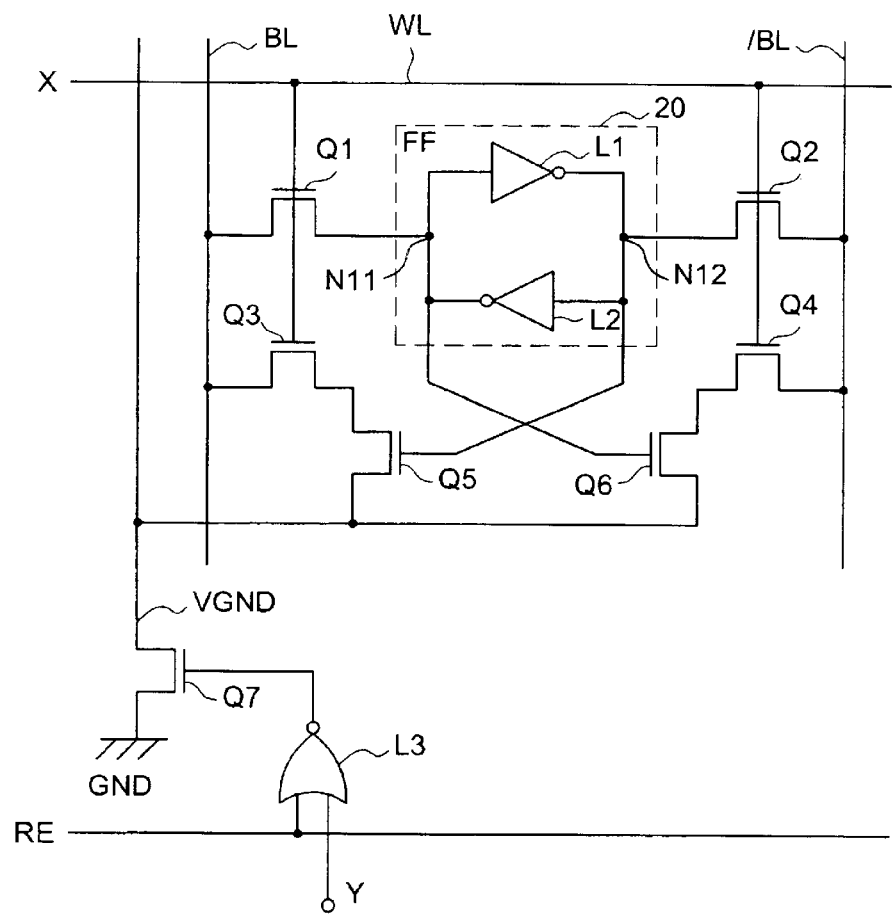
FIG. 4 is a diagram of the configuration of a conventional SRAM.

FIG. 3 is a diagram of the configuration of an SRAM showing the second embodiment of the present invention. The same reference numerals as in FIG. 1 denote the same elements in FIG. 3.

In this SRAM, in order to operate the acceleration circuit 10 in only a data read state, a gate circuit constituted by inverters 4 and 5, a NOR gate (NOR) 6, and a AND gate (AND) 7.

More specifically, a selection signal X is given to the first input side of the AND gate 7 and to the first input side of the NOR gate 6 through the inverter 4. A write control signal WE is designed to be given to the second input sides of the NOR gate 6 and the AND gate 7 through the inverter 5. The output side of the NOR gate 6 is connected to the word line WL, and the output side of the AND gate 7 is connected to the gates of the N-channel MOS transistors 11 and 13. The remaining configuration is the same as that in FIG. 1.

An operation will be described below.

In a data write state, when the write control signal WE goes to level "H" while write data is transmitted to the bit line pair BL and /BL, an output signal from the inverter 5 goes to level "L". When the selection signal X goes to level "H", an output signal from the NOR gate 6, i.e., the word line WL goes to level "H", and the N-channel MOS transistors 2 and 3 are turned on. When the N-channel MOS transistors 2 and 3 are turned on, the data on the bit line pair BL and /BL are held in the flip-flop 1 between the storage nodes N1 and N2. At this time, since an output signal S7 from the AND gate 7 is set at level "L", the N-channel MOS transistors 11 and 13 are in an OFF state not to affect the write operation of the acceleration circuit 10.

In the data read state, any one of the storage nodes N1 and N2 goes to "H" depending on the value of data held in the flip-flop 1. For example, when the storage node N1 is set at level "H", the threshold voltages of the N-channel MOS transistors 13 and 14 having the channel regions connected to the storage node N1 decrease, and the current drive capabilities of the N-channel MOS transistors 13 and 14 increase. On the other hand, since the storage node N2 is set at level "L", the channel regions of the N-channel MOS transistors 11 and 12 are set at level "L", and the threshold voltages of the N-channel MOS transistors 11 and 12 do not decrease.

In this state, when the selection signal X and the write control signal WE go to level "H" and level "L", respectively, the output signal S7 from the AND gate 7 goes to "H" level, and the N-channel MOS transistors 11 and 13 are turned on. At this time, since the N-channel MOS transistors 13 and 14 serve as transistors which achieve high current drive capabilities by the potential of the storage node N1, the bit line /BL is driven by the flip-flop 1 and drawn in the ground potential GND at a high speed by the N-channel MOS transistors 13 and 14. In this manner, the potentials of the storage nodes N1 and N2 are read into the bit line pair BL and /BL at a high speed.

As described above, the SRAM according to the second embodiment has the gate circuit constituted by the NOR gate 6 and the AND gate 7 to operate the acceleration circuit 10 in only a data read state. For this reason, the operation of the acceleration circuit 10 is stopped in states other than the data read state, not only the same advantage as that in the first embodiment, but also a low power consumption can be advantageously achieved.

The preferred embodiments of the semiconductor memory device according to the present invention have been described with reference to the accompanying drawings. However, the present invention is not limited to the embodiments. It is apparent that a person skilled in the art can arrive various changes and modifications within technical idea described in the spirit and scope of the invention. As a matter of course, it is understood that these changes and modifications belong to the technical scope. As an example of the changes, the followings are known.

(a) The sectional structure in FIG. 2 is an example of a double-well CMOS. The present invention is not limited to the structure. For example, in an SOI (Silicon on Insulator), a body corresponds to a channel region.

(b) The gate circuit constituted by the inverters 4 and 5, the NOR gate 6, and the AND gate 7 shown in FIG. 3 is an example. Any circuit which can be controlled in the same manner as the gate circuit can be used.

(c) The above explanation has been performed such that the power supply voltage is set at 0.5 V. However, the power supply voltage is not limited to the value, and the power supply voltage can be appropriately replaced with any power supply voltage at which diodes formed in the storage holding circuit and the acceleration circuit in the SRAM are not turned on.

As has been described above, according to the present invention, the semiconductor memory device has the acceleration circuit constituted by the third and fourth transistors which have channel regions connected to the second storage node and which control connection between the first bit line and the common potential on the basis of the potential of the second storage node in a selection state or a data read state, and the fifth and sixth transistors which have channel regions connected to the first storage node and which control connection between the second bit line and the common potential on the basis of the potential of the first storage node in a selection state or a data read state. For this reason, the threshold voltages of the transistors of the acceleration circuit connected to the bit line which outputs a signal at level "L" decrease, and a high-speed read operation can be performed at a low power supply voltage.

A low power consumption can be achieved by a simple circuit configuration without complex manufacturing steps used in an MTCMOS.

What is claimed is:

1. A semiconductor memory device comprising:
   first and second bit lines for inputting/outputting complementary data;
   a first transistor for controlling connection between a first storage node and the first bit line on the basis of a selection signal;
   a second transistor for controlling connection between a second storage node and the second bit line on the basis of the selection signal;

a flip-flop for holding potentials of the first and second storage nodes to output the potentials;

a third transistor, having a channel region given the same potential of the second storage node, to control connection between a first internal node and the first bit line on the basis of the selection signal;

a fourth transistor, having a channel region given the same potential of the second storage node, to control connection between a common potential and the first internal node on the basis of the potential of the second storage node;

a fifth transistor, having a channel region given the same potential of the first storage node, to control connection between a second internal node and the second bit line on the basis of the selection signal; and a sixth transistor, having a channel region given the same potential of the first storage node, to control connection between the common potential and the second internal node on the basis of the potential of the first storage node.

2. A semiconductor memory device according to claim 1, wherein the first to sixth transistors are formed on a surface of a semiconductor substrate, the third and fourth transistors are formed in a first conductivity type well formed in the surface of the semiconductor substrate, and the fifth and sixth transistors are formed in a second conductivity type well formed in the surface of the semiconductor substrate.

3. A semiconductor memory device according to claim 1, wherein threshold voltages of the first to sixth transistors are almost equal to each other.

4. A semiconductor memory device according to claim 1, wherein threshold voltages of the first to sixth transistors are lower than a power supply voltage.

5. A semiconductor memory device comprising:

first and second bit lines for inputting/outputting complementary data;

a first transistor to control connection between a first storage node and the first bit line on the basis of a selection signal;

a second transistor to control connection between a second storage node and the second bit line on the basis of the selection signal;

a flip-flop for holding potentials of the first and second storage nodes to output the potentials;

a third transistor, having a channel region given the same potential of the second storage node, to connect a first internal node to the first bit line in a data read state;

a fourth transistor, having a channel region given the same potential of the second storage node, to control connection between a common potential and the first internal node on the basis of the potential of the second storage node;

a fifth transistor, having a channel region given the same potential of the first storage node, to connect a second internal node to the second bit line in a data read state; and a sixth transistor, having a channel region given the same potential of the first storage node, to control connection between the common potential and the second internal node on the basis of the potential of the first storage node.

6. A semiconductor memory device according to claim 5, wherein the first to sixth transistors are formed on a surface of a semiconductor substrate, the third and fourth transistors are formed in a first conductivity type well formed in the surface of the semiconductor substrate, and the fifth and sixth transistors are formed in a second conductivity type well formed in the surface of the semiconductor substrate.

7. A semiconductor memory device according to claim 5, wherein threshold voltages of the first to sixth transistors are almost equal to each other.

8. A semiconductor memory device according to claim 5, wherein threshold voltages of the first to sixth transistors are lower than a power supply voltage.

9. A semiconductor memory device comprising:

first and second bit lines for inputting/outputting complementary data;

a first transistor to control connection between a first storage node and the first bit line on the basis of a selection signal;

a second transistor to control connection between a second storage node and the second bit line on the basis of the selection signal;

a flip-flop for holding potentials of the first and second storage nodes to output the potentials;

a third transistor, having a channel region given the same potential of the second storage node, to connect a first internal node to the first bit line in a data read state;

a fourth transistor, having a channel region given the same potential of the second storage node, to control connection between a common potential and the first internal node on the basis of the potential of the second storage node;

a fifth transistor, having a channel region given the same potential of the first storage node, to connect a second internal node to the second bit line in a data read state;

a sixth transistor, having a channel region given the same potential of the first storage node, to control connection between the common potential and the second internal node on the basis of the potential of the first storage node;

a word line connected to the first and second transistors;

a signal line connected to the third and fifth transistors;

a logical circuit for outputting the selection signal to the word line when data is written in the flip-flop and for outputting a control signal for controlling the third and fifth transistors to the signal line in the data read state.

10. A semiconductor memory device according to claim 9, wherein the logical circuit includes:

a first inverter having an input side to which the selection signal is given;

a second inverter having an input side to which a write control signal for outputting the control signal is given;

a NOR gate having a first input side to which the selection signal is given through the first inverter, having a second input side to which the write control signal is given through the second inverter, and having an output side which is connected to the word line;

an AND gate having a first input side to which the selection signal is given, having a second input side to which the write control signal is given through the second inverter, and having an output side which is connected to gates of the third and fifth transistors.

11. A semiconductor memory device according to claim 9, wherein the first to sixth transistors are formed on a surface of a semiconductor substrate, the third and fourth transistors are formed in a first conductivity type well formed in the surface of the semiconductor substrate, and the fifth and sixth transistors are formed in a second conductivity type well formed in the surface of the semiconductor substrate.

12. A semiconductor memory device according to claim 9, wherein threshold voltages of the first to sixth transistors are almost equal to each other.

13. A semiconductor memory device according to claim 9, wherein threshold voltages of the first to sixth transistors are lower than a power supply voltage.

* * * * *